(12) United States Patent
Hu et al.

(10) Patent No.: US 11,402,962 B2
(45) Date of Patent: Aug. 2, 2022

(54) DISPLAY DEVICE

(71) Applicant: Wuhan China Star Optoelectronics Semiconductor Display Technology Co., Ltd., Hubei (CN)

(72) Inventors: Dongxue Hu, Hubei (CN); Zhongcao He, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/266,649

(22) PCT Filed: Apr. 28, 2020

(86) PCT No.: PCT/CN2020/087441
§ 371 (c)(1),
(2) Date: Feb. 8, 2021

(87) PCT Pub. No.: WO2021/159611
PCT Pub. Date: Aug. 19, 2021

(65) Prior Publication Data
US 2022/0113823 A1    Apr. 14, 2022

(30) Foreign Application Priority Data
Feb. 11, 2020 (CN) .......................... 202010087206.8

(51) Int. Cl.
*G06F 3/046* (2006.01)
*G06F 3/041* (2006.01)
*H01L 27/32* (2006.01)

(52) U.S. Cl.
CPC ............ *G06F 3/046* (2013.01); *G06F 3/0412* (2013.01); *G06F 3/0416* (2013.01); *H01L 27/323* (2013.01)

(58) Field of Classification Search
None
See application file for complete search history.

(56) References Cited

U.S. PATENT DOCUMENTS

| 2011/0090169 | A1 | 4/2011 | Karhinicmi |
| 2012/0098790 | A1 | 4/2012 | Han |
| 2013/0141084 | A1 | 6/2013 | Hsieh et al. |
| 2016/0026301 | A1 | 1/2016 | Zhou et al. |
| 2016/0124562 | A1 | 5/2016 | Lu et al. |
| 2016/0349887 | A1 | 12/2016 | Wang |
| 2017/0045978 | A1* | 2/2017 | Xu .................. G06F 3/0412 |

(Continued)

FOREIGN PATENT DOCUMENTS

| CN | 103092446 | 5/2013 |
| CN | 103543899 | 4/2014 |
| CN | 104111755 | 10/2014 |

(Continued)

*Primary Examiner* — Stephen T. Reed

(57) ABSTRACT

A display device is provided. The display device includes an array substrate, an encapsulation layer formed on the array substrate, and a touch layer formed on a side of the encapsulation layer facing away from the array substrate. The touch layer comprises an electromagnetic induction layer disposed therein, the electromagnetic induction layer comprises a plurality of induction coils, a first end of the induction coil is electrically connected to a first signal line, and a second end of the induction coil is electrically connected to a second signal line.

18 Claims, 8 Drawing Sheets

(56) References Cited

U.S. PATENT DOCUMENTS

2018/0048177 A1\* 2/2018 Huang .................... H01L 28/10

FOREIGN PATENT DOCUMENTS

| CN | 104298411 | 1/2015 |
| CN | 104503654 | 4/2015 |
| CN | 107422933 | 12/2017 |
| CN | 109696992 | 4/2019 |
| CN | 109976568 | 7/2019 |

\* cited by examiner

DISPLAY DEVICE

RELATED APPLICATIONS

This application is a National Phase of PCT Patent Application No. PCT/CN2020/087441 having International filing date of Apr. 28, 2020, which claims the benefit of priority of Chinese Patent Application No. 202010087206.8 filed on Feb. 11, 2020. The contents of the above applications are all incorporated by reference as if fully set forth herein in their entirety.

FIELD AND BACKGROUND OF THE INVENTION

The present application relates to the field of display technology, and particularly to a display device.

Electromagnetic screens refers to electromagnetic touch screens that uses electromagnetic resonance technology and can be used with an electromagnetic pen to achieve precision touch and original handwriting. As the electromagnetic pen approaches the electromagnetic screen, this cases induction coils of an electromagnetic screen to generate an induction current in the horizontal and vertical directions, thereby obtaining position information of the electromagnetic pen.

However, existing electromagnetic screens are generally placed on the back of the display module as an independent plug-in touch device, and resulting in a larger thickness of the display module.

SUMMARY OF THE INVENTION

The present application provides a display device to solve a problem of the existing electromagnetic screen generally placed on the back of the display module as an independent touch device by a plug-in way, that resulting in a larger thickness of the display module.

The present application provides a display device, comprising:

an array substrate;
an encapsulation layer formed on the array substrate; and
a touch layer formed on a side of the encapsulation layer facing away from the array substrate;
wherein the touch layer comprises an electromagnetic induction layer disposed therein, the electromagnetic induction layer comprises a plurality of induction coils, a first end of the induction coil is electrically connected to a first signal line, and a second end of the induction coil is electrically connected to a second signal line.

In the display device of the present application, the electromagnetic induction layer comprises:

a plurality of first induction coils formed on the encapsulation layer, wherein the plurality of first induction coils extend along a first direction and are disposed at intervals in a second direction;
a first insulation layer covering the first induction coil; and
a plurality of second induction coils formed on a side of the first insulation layer facing away from the first touch layer, wherein the plurality of second induction coils extend along a second direction and are disposed at intervals in a first direction.

In the display device of the present application, the touch layer comprises a plurality of first touch driving electrodes formed on the encapsulation layer and a plurality of second touch driving electrodes formed on the first insulation layer; the plurality of first touch driving electrodes extend along a first direction and are disposed at intervals in a second direction, and each of the first induction coils correspond to one of the first touch driving electrodes and surround the first touch driving electrodes; the plurality of second touch driving electrodes extend along a second direction and are disposed at intervals in a first direction, each of the second induction coils correspond to one of the second touch driving electrodes and surround the second touch drive electrodes.

In the display device of the present application, the array substrate comprises a plurality of sub-pixels disposed in an array, each of the first touch driving electrode and the second touch driving electrode comprises a grid structure, and an orthographic projection of mesh holes of the grid structures projected on the array substrate correspond one-to-one with the sub-pixels.

In the display device of the present application, the first signal line comprises a first reference voltage signal line formed in the same layer as the first induction coil and a second reference voltage signal line formed in the same layer as the second induction coil; and the second signal line comprises a first electromagnetic signal line formed in the same layer as the first induction coil and a second electromagnetic signal line formed in the same layer as the second induction coil.

In the display device of the present application, the plurality of induction coils are positioned on the encapsulation layer in an array arrangement, and the induction coils are multiplexed as third touch driving electrodes.

In the display device of the present application, the induction coils are spiral.

In the display device of the present application, the first signal line and the induction coils are formed in the same layer, the first signal line is electrically connected to a terminal end of the induction coil; the electromagnetic induction layer further comprises a second insulation layer covering the induction coil and the first signal line, the second signal line is formed on the second insulation layer, and the second signal line penetrates through the second insulation layer and are electrically connected to a beginning end of the induction coil.

In the display device of the present application, the first signal line is disposed along a first direction or a second direction, and the first signal line is disposed in a gap region between two adjacent columns or two adjacent rows of the induction coils.

In the display device of the present application, the second signal line is parallel to the first signal line.

A display device, comprising:

an array substrate, wherein the array substrate is a flexible substrate or a rigid substrate;
an encapsulation layer formed on the array substrate; and
a touch layer formed on a side of the encapsulation layer facing away from the array substrate;
wherein the touch layer comprises an electromagnetic induction layer disposed therein, the electromagnetic induction layer comprises a plurality of induction coils, a first end of the induction coil is electrically connected to a first signal line, and a second end of the induction coil is electrically connected to a second signal line.

In the display device of the present application, the electromagnetic induction layer comprises:

a plurality of first induction coils formed on the encapsulation layer, wherein the plurality of first induction coils extend along a first direction and are disposed at intervals in a second direction;

a first insulation layer covering the first induction coil; and a plurality of second induction coils formed on a side of the first insulation layer facing away from the first touch layer, wherein the plurality of second induction coils extend along a second direction and are disposed at intervals in a first direction.

In the display device of the present application, the touch layer comprises a plurality of first touch driving electrodes formed on the encapsulation layer and a plurality of second touch driving electrodes formed on the first insulation layer;

the plurality of first touch driving electrodes extend along a first direction and are disposed at intervals in a second direction, and each of the first induction coils correspond to one of the first touch driving electrodes and surround the first touch driving electrodes; the plurality of second touch driving electrodes extend along a second direction and are disposed at intervals in a first direction, each of the second induction coils correspond to one of the second touch driving electrodes and surround the second touch drive electrodes.

In the display device of the present application, the array substrate comprises a plurality of sub-pixels disposed in an array, each of the first touch driving electrode and the second touch driving electrode comprises a grid structure, and an orthographic projection of mesh holes of the grid structures projected on the array substrate correspond one-to-one with the sub-pixels.

In the display device of the present application, the first signal line comprises a first reference voltage signal line formed in the same layer as the first induction coil and a second reference voltage signal line formed in the same layer as the second induction coil; and the second signal line comprises a first electromagnetic signal line formed in the same layer as the first induction coil and a second electromagnetic signal line formed in the same layer as the second induction coil.

In the display device of the present application, the plurality of induction coils are positioned on the encapsulation layer in an array arrangement, and the induction coils are multiplexed as third touch driving electrodes.

In the display device of the present application, the induction coils are spiral.

In the display device of the present application, the first signal line and the induction coils are formed in the same layer, the first signal line is electrically connected to a terminal end of the induction coil; the electromagnetic induction layer further comprises a second insulation layer covering the induction coil and the first signal line, the second signal line is formed on the second insulation layer, and the second signal line penetrates through the second insulation layer and are electrically connected to a beginning end of the induction coil.

In the display device of the present application, the first signal line is disposed along a first direction or a second direction, and the first signal line is disposed in a gap region between two adjacent columns or two adjacent rows of the induction coils.

In the display device of the present application, the second signal line is parallel to the first signal line.

The benefit of the present application is: employing the first signal line and the second signal line to form an electrical loop with the induction coil, as the electromagnetic pen approaching the region corresponding to the induction coil on the display screen, resulting in the induction coil to generate an induction current, thereby obtaining the position information of the electromagnetic pen, at the same time, integrating the electromagnetic induction layer into the touch layer, so that the touch layer also shows an electromagnetic induction function, and replacing the external electromagnetic screen module to realize the integrated function of the electromagnetic screen and the capacitive screen, which can reduce the overall thickness of the display device.

FIGURE ILLUSTRATION

Figure 1:
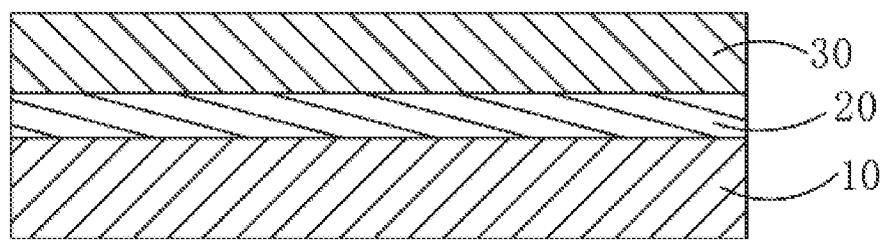
FIG. 1 is a schematic structural diagram of a display device provided by one embodiment of the present application.

10 array substrate; 20 encapsulation layer; 30 touch layer; 31 first touch driving electrode; 32 second touch driving electrode; 41 induction coil; 411 first induction coil; 412 second induction coil; 51 first signal line; 511 first reference voltage signal line; 512 second reference voltage signal line; 52 second signal line; 521 first electromagnetic signal line; 522 second electromagnetic signal line; 53 lead line segment; 54 fold line segment; 55 integrated line segment; 61 first insulation layer; 62 second insulation layer; 71 first protective layer.

DESCRIPTION OF SPECIFIC EMBODIMENTS OF THE INVENTION

The following description of each embodiment refers to an additional illustration to illustrate specific embodiments that can be implemented in the present application. Directional terms mentioned in this application, such as "upper", "lower", "front", "back", "left", "right", "inner", "outer", "side", etc. are the direction of the schema. Therefore, the directional language used is to illustrate and understand this application, not to limit this application. In the figure, units with similar structures are indicated by the same reference numerals.

The present application provides a display device to solve a problem of the existing electromagnetic screen generally placing on the back of the display module as an independent touch device by a plug-in way, that resulting in a larger thickness of the display module.

In a first embodiment:

A display device, referring to FIG. 1, includes an array substrate 10, an encapsulation layer 20 formed on the array substrate 10, and a touch layer 30 formed on a side of the encapsulation layer 20 facing away from the array substrate 10.

It should be noted that, the display device is an organic light-emitting diode (OLED) display device, the array substrate 10 is a flexible substrate or a rigid substrate; the encapsulation layer 20 is an organic layer, a stacked structure with overlapping the inorganic layers and the organic layers; the touch layer 30 is a capacitive touch layer 30.

Figure 2:
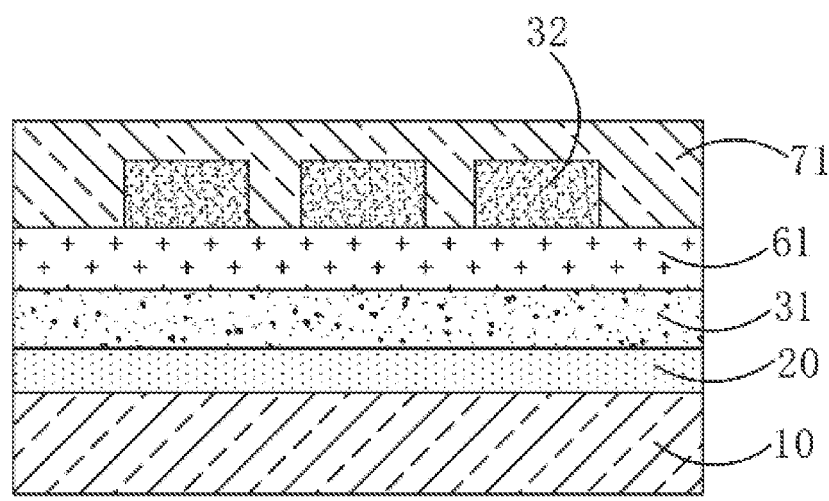
FIG. 2 is a schematic structural diagram of the touch layer provided by one embodiment of the present application.
Figure 3:
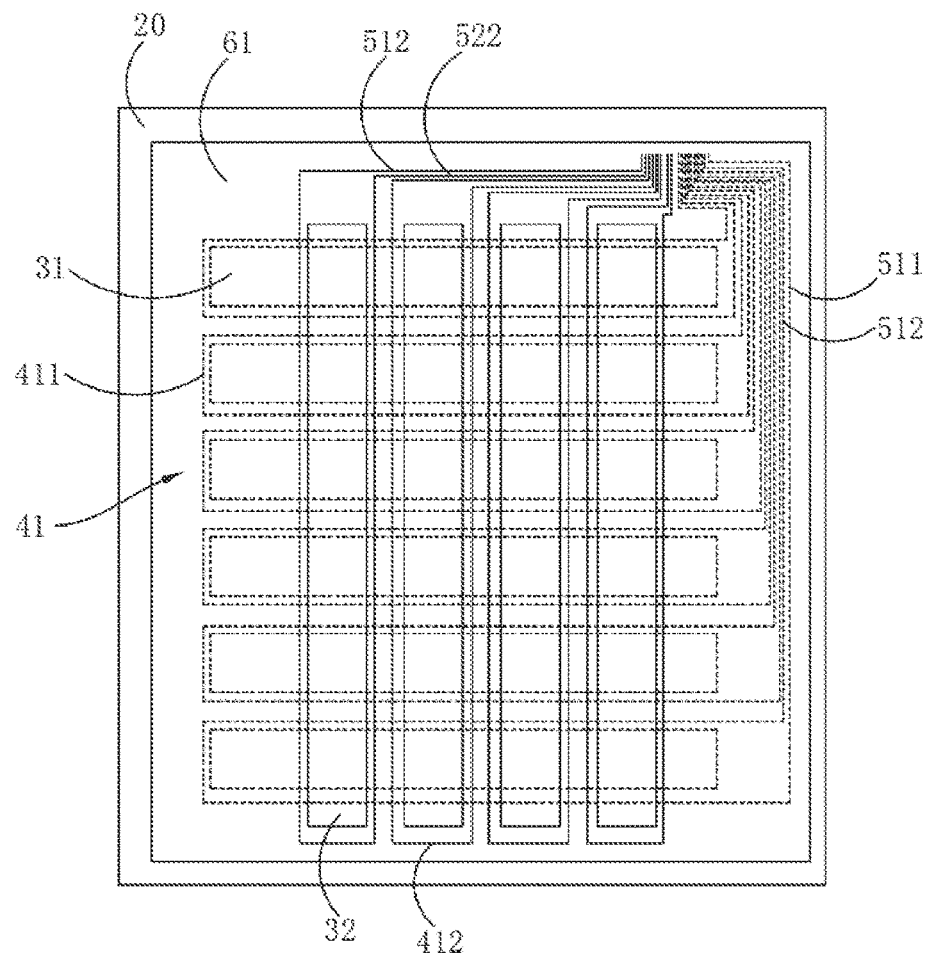
FIG. 3 is a planar schematic structural diagram of the touch layer provided by one embodiment of the present application.

Specifically, referring to FIG. 2 and FIG. 3, the touch layer 30 includes an electromagnetic induction layer disposed therein, the electromagnetic induction layer comprises a plurality of induction coils 41, a first end of an induction coil 41 is electrically connected to a first signal line 51, and a second end of the induction coil 41 is electrically connected to a second signal line 52.

It should be noted that, one of the first signal line 51 or the second signal line 52 is connected to the ground or a reference signal line with a lower potential, and the other outputs an electromagnetic induction signal to measure an electromagnetic signal.

Specifically, the display device further includes an electromagnetic pen cooperating with the electromagnetic induction layer.

The first signal line 51 and the second signal line 52 form an electrical circuit with the induction coil 41, so as the electromagnetic pen approaches the region corresponding to the induction coil 41 on the display screen, the electromagnetic pen will induce the induction coil 41 to generate an induction current to obtain a position information of the electromagnetic pen, and at the same time, the electromagnetic induction layer is integrated into the touch layer 30 to replace an external electromagnetic screen module, so as to realize integrated functions of the electromagnetic screen and a capacitive screen, reducing an overall thickness of the display device.

Specifically, the electromagnetic induction layer includes a plurality of first induction coils 411 formed on the encapsulation layer 20, a first insulation layer 61 covering the first induction coils 411, and a plurality of second induction coils 412 formed on a side of the first insulation layer 61 facing away from the first touch layer 30.

It should be noted that, the first insulation layer 61 can be made of inorganic material such as silicon nitride and silicon oxide, or organic materials such as optical glue.

The plurality of first induction coils 411 extend along a first direction and are disposed at intervals in a second direction, the plurality of second induction coils extend along a second direction and are disposed at intervals in a first direction.

It should be noted that, the first direction and the second direction are perpendicular to each other, for example, the first direction is horizontal and the second direction is longitudinal (referring to FIG. 3). When the electromagnetic pen approaches the touch layer 30, it will induce the induction coil 41 in the first direction and the second direction in the touch layer 30 to generate an induced current, thereby obtaining an accurate position information of the electromagnetic pen.

Specifically, the touch layer 30 includes a plurality of first touch driving electrodes 31 formed on the encapsulation layer 20 and a plurality of second touch driving electrodes 32 formed on the first insulation layer 61.

The plurality of first touch driving electrodes 31 extend along a first direction and are disposed at intervals in a second direction, and each of the first induction coils 411 correspond to one of the first touch driving electrodes 31 and surround the first touch driving electrodes 31.

The plurality of second touch driving electrodes 32 extend along a second direction and are disposed at intervals in a first direction, each of the second induction coils 412 correspond to one of the second touch driving electrodes 32 and surround the second touch drive electrodes 32.

It should be noted that, the touch layer 30 is a miscible touch layer 30, and each of the first touch driving electrodes 31 and each of the second touch driving electrodes 32 are connected to at least one metal connecting line, and the connecting line is used as an output touch signal. When the display device is pressed and touched, changes to capacitance between the first touch driving electrodes 31 and the second touch driving electrodes 32 occurs, and the touch occurrence point is determined according to the capacitance change point, thereby realizing a touch function.

It should be noted that, the first induction coils 411 are disposed as surrounding the first touch driving electrodes 31, the second induction coils 412 are disposed as surrounding the second touch driving electrodes 32, therefore, the induction coil 41 is integrated in a gap region between adjacent touch electrodes, thus integrating the electromagnetic induction layer into the touch layer 30, reasonably utilizing the vacant region, and reducing the area occupied by the induction coil 41.

Specifically, the first signal line 51 includes a first reference voltage signal line 511 formed in the same layer as the first induction coil 41 and a second reference voltage signal line 512 formed in the same layer as the second induction coil 412; the second signal line 52 comprises a first electromagnetic signal line 521 formed in the same layer as the first induction coil 411 and a second electromagnetic signal line 522 formed in the same layer as the second induction coil 412.

It should be noted that, the first signal line 51 is connected to the ground or the reference signal line with lower potential, the second signal line 52 outputs the electromagnetic induction signal to measure the electromagnetic signal.

It should be noted that, the array substrate 10 includes a display region and a border region around the display region, and each of the first signal line 51 and the second signal line 52 are disposed on the touch layer 30 in an region corresponding to the border region, thereby preventing the first signal line 51 and the second signal line 52 from blocking light emitted from the display region.

In one embodiment, the electromagnetic induction layer further includes a first protective layer 71 covering the second induction coils 412 and the second touch driving electrodes 32.

Figure 4:
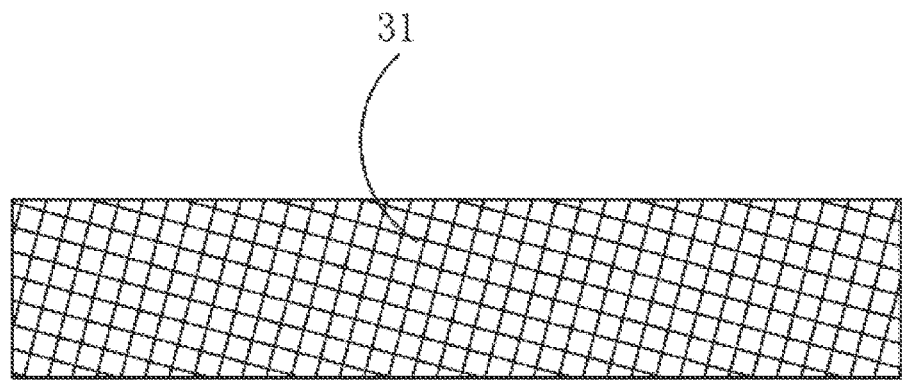
FIG. 4 is a schematic structural diagram of the first touch driving electrode layer provided by one embodiment of the present application.

Specifically, referring to FIG. 3 and FIG. 4, the array substrate 10 includes a plurality of sub-pixels disposed in an array, each of the first touch driving electrode 31 and the second touch driving electrode 32 comprises a grid structure, and an orthographic projection of mesh holes of the grid structures projected on the array substrate 10 correspond one-to-one the sub-pixels.

It should be noted that, fabricating materials of the first touch driving electrodes 31 and the second touch driving electrodes 32 include but are not limited to one or more of molybdenum, aluminum, titanium, molybdenum alloy, aluminum alloy, and titanium alloy, the first touch driving electrodes 31 and the second touch driving electrodes 32 are a metal grid structure, so as to prevent the first touch driving electrodes 31 and the second touch driving electrodes 32 from blocking light emitted from the sub-pixel region.

Figure 5:
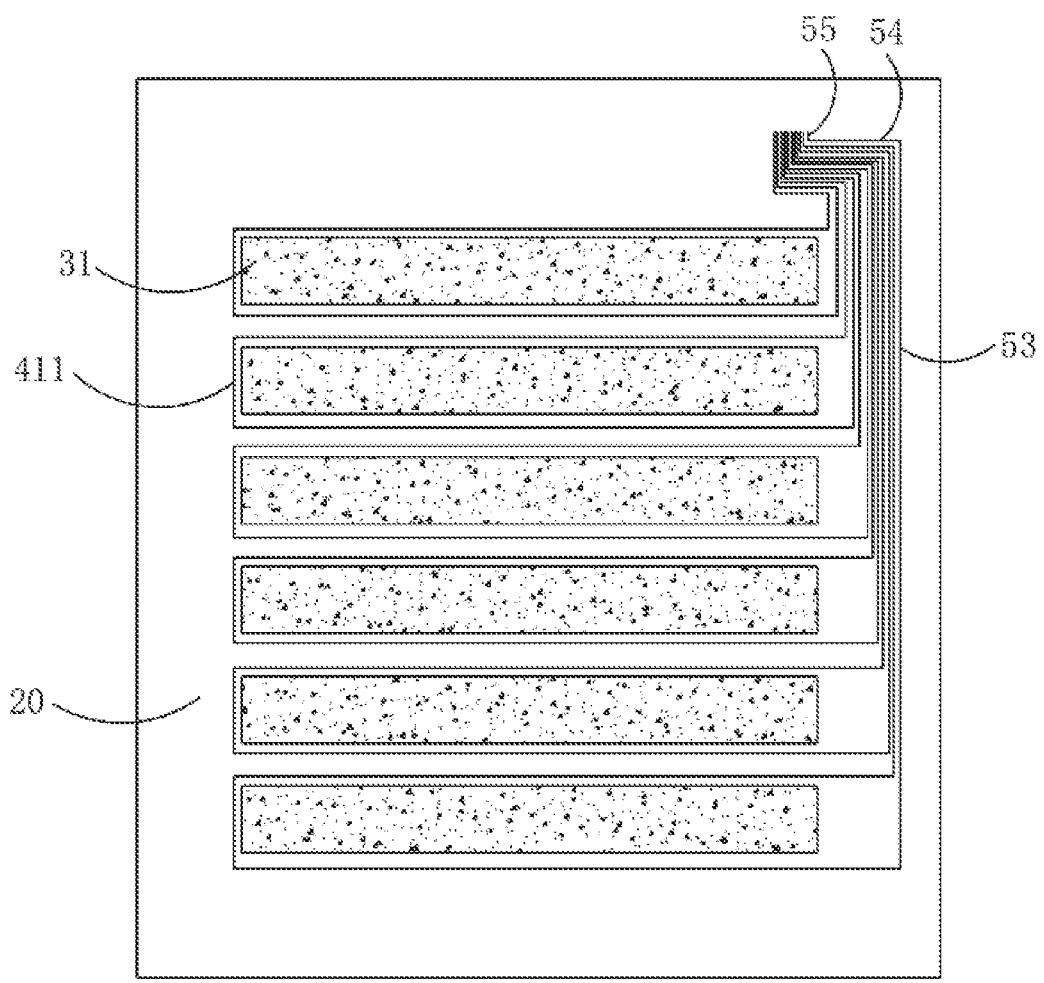
FIG. 5, FIG. 6 and FIG. 7 are diagrams of manufacturing the touch layer provided by one embodiment of the present application.
Figure 6:
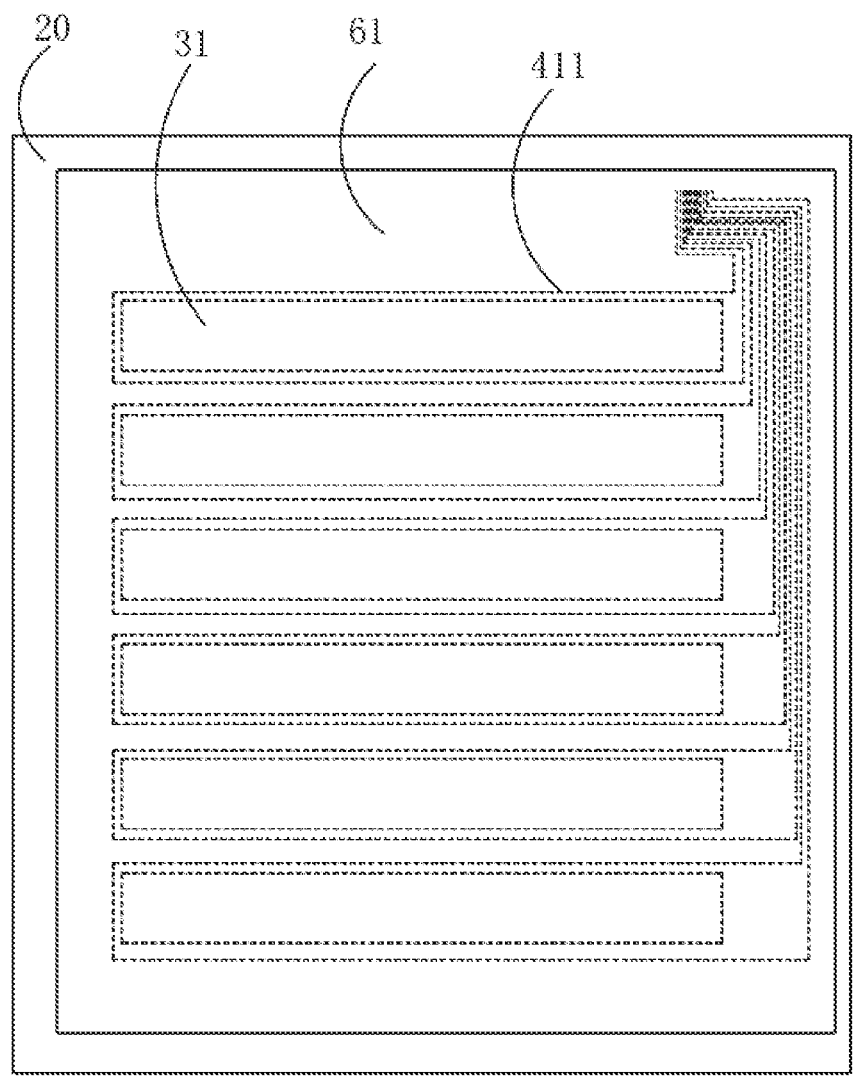
Figure 7:
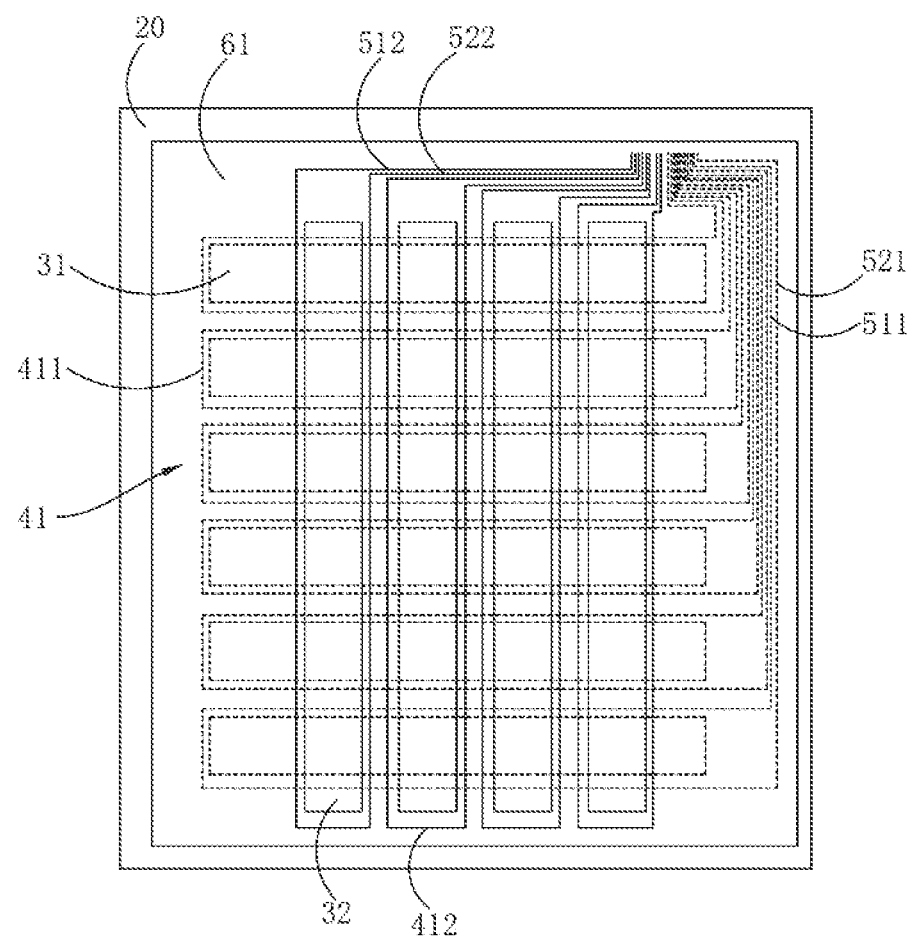

Referring FIG. 5 to FIG. 7, FIG. 5 to FIG. 7 are diagrams of manufacturing the touch layer 30 provided by one embodiment of the present application.

Referring to FIG. 5, a first touch driving electrodes 31 and a first induction coils 411 are disposed in the first direction in an arrangement on the encapsulation layer 20, and the first induction coils 411 are disposed around the first touch driving electrodes 31 simultaneously, a first reference voltage signal line 511 and a first electromagnetic signal line 521 connected to the first induction coils 411 are formed on the encapsulation layer 20.

It should be noted that, the first induction coils 411 and the first touch driving electrodes 31 can be formed by the same etching process, or formed by different process respectively.

Referring to FIG. 6, the first touch driving electrodes 31, the first induction coils 411, the first reference voltage signal lines 511, and the first electromagnetic signal lines 521 are formed on the first insulation layer 61.

Referring to FIG. 7, the second touch driving electrodes 32 and the second induction coils 412 are disposed on the first insulation layer 61 extending along the second direction, the second induction coils 412 surrounds the second touch driving electrode 32, and the second reference voltage signal lines 512 and the second electromagnetic signal lines 522 connecting to the second induction coils 412 are formed on the first insulation layer 61.

It should be noted that, the second induction coils 412 and the second touch driving electrodes 32 can be formed by the same etching process, or by different process respectively.

In one embodiment, each of the first signal lines 51 and the second signal lines 52 include a lead line segment 53 disposed in the second direction, a fold line segment 54 disposed in the first direction, and an integrated line segment 55 disposed in the second direction; one end of the lead line segment 53 is electrically connected to one end of the induction coil 41, a first end of the fold line segment 54 is connected to one end of the lead line segment 53, the integrated line segment 55 is electrically connected to a second end of the fold line segment 54, the lead line segment 53 is used to connect the induction coil 41, and the fold line section 54 and the integrated line segment 55 are used for converging and collecting, which is convenient for routing in a small area.

In a second embodiment:

A display device, the difference between the display devices of the first and second embodiments is the structure of the touch layer 30 and the electromagnetic induction layer.

Figure 8:
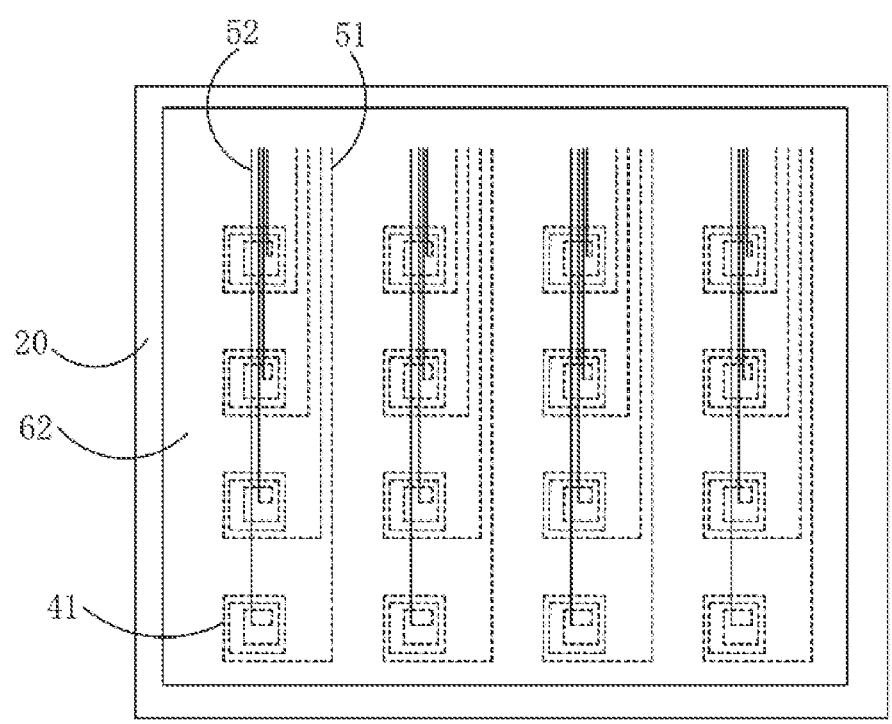
FIG. 8 is a planar schematic structural diagram of the electromagnetic induction layer provided by another embodiment of the present application.

Specifically, referring to FIG. 8, the plurality of the induction coils 41 are positioned on the encapsulation layer 20 in an array arrangement, and the induction coils 41 are multiplexed as third touch driving electrodes.

It should be noted that, the induction coils 41 show touch induction function and electromagnetic induction function at the same time by optimizing the structure of the induction coils 41, thereby, there is no need to an additional touch layer 30, and the overall thickness of the display device is reduced.

It should be noted that, the touch layer 30 is an self-capacitive touch layer 30. As it performs capacitive sensing, the electromagnetic induction function is stopped, and the first signal line 51 and the second signal line 5 connecting to each of induction coils 41 are connected to the same the driving signal, and at the same time, the same induction signal is output to realize the touch induction function. As it performs the electromagnetic induction, the touch induction function is stopped, and the induction coils 41 output the electromagnetic induction signal to realize the electromagnetic induction function.

Specifically, the overall shape of the induction coils is spiral, thereby, the induction coils 41 show an electromagnetic induction function, and at the same time, an area of the induction coils 41 is increased to improve the accuracy of touch induction, and the number of the induction coils 41 is increased to augment the magnetic flux of electromagnetic induction, thereby increasing the accuracy of electromagnetic induction.

It should be noted that, the overall shape of the induction coils can be a square spiral or a circular spiral, and an overall length and width of each induction coil 41 are 3-6 mm.

Specifically, the first signal line 51 and the induction coils 41 are formed in the same layer, the first signal line 51 is electrically connected to a terminal end of the induction coil 41; the electromagnetic induction layer further includes a second insulation layer 62 covering the induction coil 41 and the first signal line 51, the second signal line 52 is formed on the second insulation layer 62, and the second signal line 52 penetrates through the second insulation layer 62 and is electrically connected to a beginning end of the induction coil 41.

It should be noted that, the overall shape of the induction coils is the spiral structure. The beginning end of the induction coil 41 is located inside the coil, and the terminal end of the induction coil 41 is located outside the coil, the connection between the beginning end of the induction coil 41 and the second signal line 52 is formed at a different layer with the induction coils 41 to prevent the second signal line 52 from causing a short circuit between the coils of the induction coil 41.

Specifically, the first signal line 51 is disposed along the first direction or the second direction. The first signal line 51 is disposed in the gap region between two adjacent columns or two adjacent rows of the induction coils 41.

Further, the second signal line 52 is parallel to the first signal line 51.

In one embodiment, the electromagnetic induction layer further includes the second induction coil 412 and a second protective layer of the second touch driving electrode 32.

Figure 9:
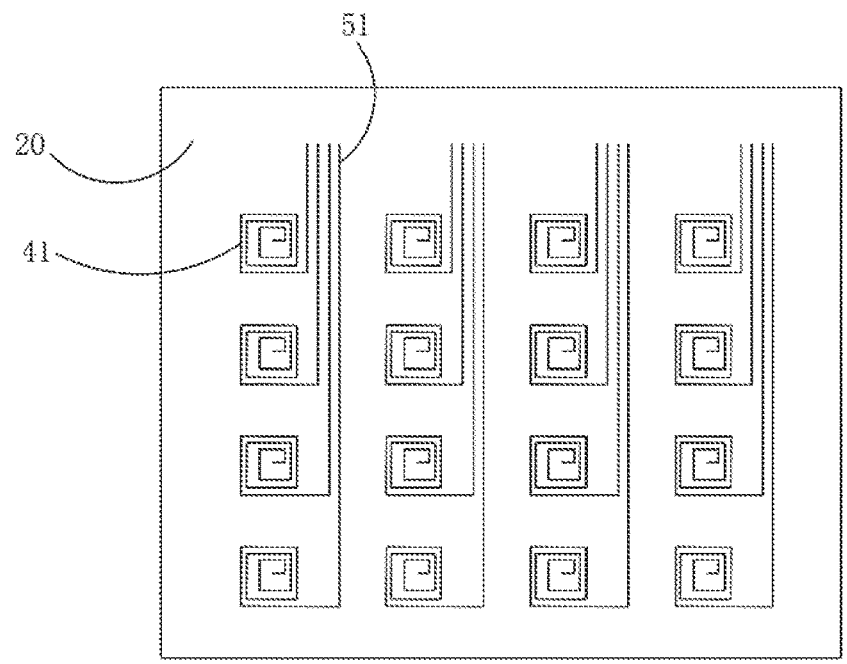
FIG. 9, FIG. 10 and FIG. 11 are diagrams of manufacturing the electromagnetic induction layer provided by another embodiment of the present application.
Figure 10:
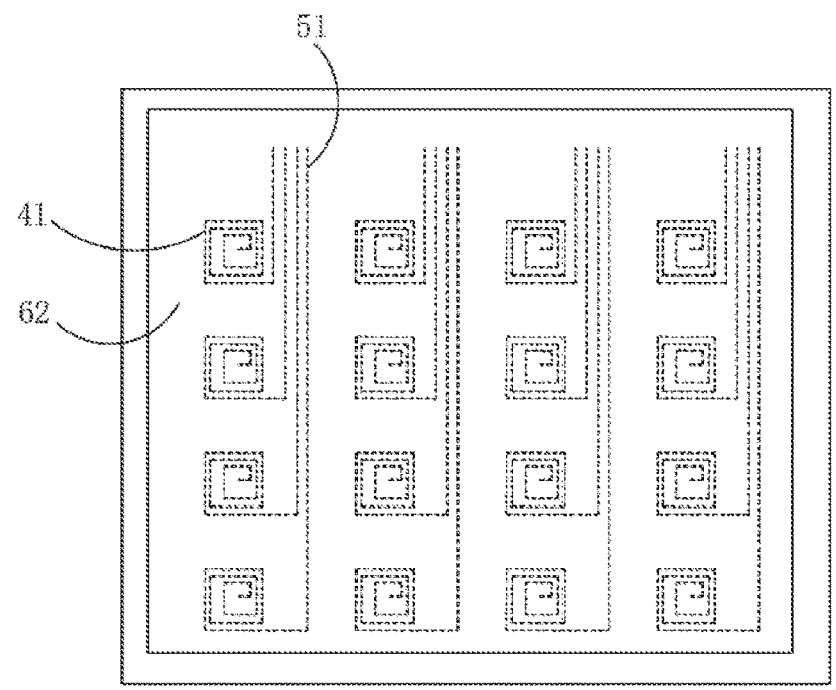
Figure 11:
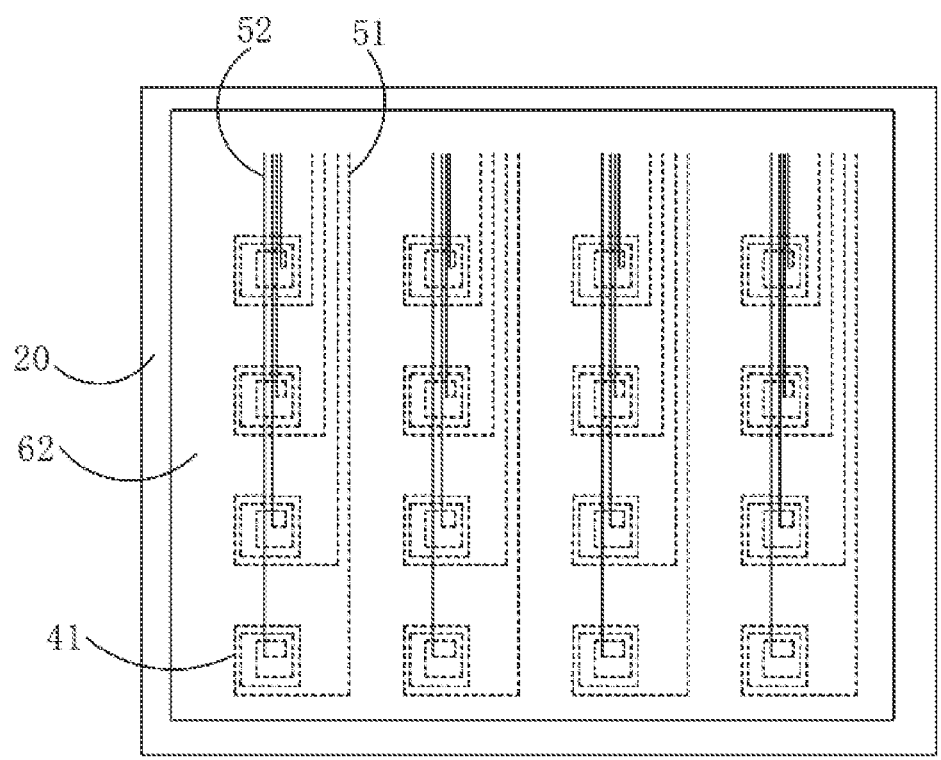

Referring to FIG. 9 to FIG. 11, FIG. 9 to FIG. 11 are diagrams of manufacturing the electromagnetic induction lacyer provided by another embodiment of the present application.

Referring to FIG. 9, a plurality of induction coils 41 arranged into an array are formed on the encapsulation layer 20, and a first signal line 51 connecting to the terminal end of the induction coil 41 is formed.

Referring to FIG. 10, a second insulation layer 62 covering the induction coil 41 and the first signal line 51 is formed.

Referring to FIG. 11, a plurality of through holes are formed on the insulation layer, and the second signal line 52 is formed penetrating through the second insulation layer and is electrically connected to the beginning end of the induction coil 41.

The benefit of the present application is: employing the first signal line 51 and the second signal line 52 to form an electrical loop with the induction coil 41, as the electromagnetic pen approaching the region corresponding to the induction coil 41 on the display screen, resulting in the induction coil 41 to generate an induction current, thereby obtaining the position information of the electromagnetic pen, at the same time, integrating the electromagnetic induction layer into the touch layer 30, so that the touch layer 30 also shows an electromagnetic induction function, and replacing the external electromagnetic screen module to realize the integrated function of the electromagnetic screen and the capacitive screen, which can reduce the overall thickness of the display device.

In the above embodiments, the description of each embodiment has its own emphasis. For a part that is not detailed in an embodiment, you can refer to the related descriptions of other embodiments.

In this article, specific examples are used to explain the principles and implementations of the present application. The descriptions of the above embodiments are only used to help understand the technical solutions and core ideas of the present application; those of ordinary skill in the art should understand: It can still modify the technical solutions described in the foregoing embodiments, or equivalently replace some of the technical features; and these modifications or replacements do not deviate from the essence of the corresponding technical solutions of the technical solutions of the embodiments of the present application.

What is claimed is:

1. A display device, comprising:
   an array substrate;
   an encapsulation layer formed on the array substrate; and
   a touch layer formed on a side of the encapsulation layer facing away from the array substrate;
   wherein the touch layer comprises an electromagnetic induction layer disposed in the touch layer, the electromagnetic induction layer comprises a plurality of induction coils, a first end of the induction coil is electrically connected to a first signal line, and a second end of the induction coil is electrically connected to a second signal line;
   wherein the electromagnetic induction layer comprises:
   a plurality of first induction coils formed on the encapsulation layer, wherein the plurality of first induction coils extend along a first direction and are disposed at intervals in a second direction;
   a first insulation layer covering the first induction coil; and
   a plurality of second induction coils formed on a side of the first insulation layer facing away from the first touch layer, wherein the plurality of second induction coils extend along the second direction and are disposed at intervals in the first direction.

2. The display device of claim 1, wherein the touch layer comprises a plurality of first touch driving electrodes formed on the encapsulation layer and a plurality of second touch driving electrodes formed on the first insulation layer; and
   the plurality of first touch driving electrodes extend along the first direction and are disposed at intervals in the second direction, and each of the first induction coils corresponds to one of the first touch driving electrodes and surrounds the first touch driving electrodes; the plurality of second touch driving electrodes extend along the second direction and are disposed at intervals in the first direction, each of the second induction coils correspond to one of the second touch driving electrodes and surrounds the second touch drive electrodes.

3. The display device of claim 2, wherein the array substrate comprises a plurality of sub-pixels disposed in an array, each of the first touch driving electrodes and the second touch driving electrodes comprise a grid structure, and an orthographic projection of mesh holes of the grid structures projected on the array substrate correspond one-to-one with the sub-pixels.

4. The display device of claim 1, wherein the first signal line comprises a first reference voltage signal line formed in a same layer as the first induction coil and a second reference voltage signal line formed in a same layer as the second induction coil; and
   the second signal line comprises a first electromagnetic signal line formed in the same layer as the first induction coil and a second electromagnetic signal line formed in the same layer as the second induction coil.

5. The display device of claim 1, wherein the plurality of induction coils are positioned on the encapsulation layer in an array arrangement, and the induction coils are multiplexed as third touch driving electrodes.

6. The display device of claim 5, wherein the induction coils are spiral.

7. The display device of claim 5, wherein the first signal line and the induction coils are formed in a same layer, the first signal line is electrically connected to a terminal end of the induction coil; the electromagnetic induction layer further comprises a second insulation layer covering the induction coil and the first signal line, the second signal line is formed on the second insulation layer, and the second signal line penetrates through the second insulation layer and is electrically connected to a beginning end of the induction coil.

8. The display device of claim 7, wherein the first signal line is disposed along a first direction or a second direction, and the first signal line is disposed in a gap region between two adjacent columns or two adjacent rows of the induction coils.

9. The display device of claim 8, wherein the second signal line is parallel to the first signal line.

10. A display device, comprising:
    an array substrate, wherein the array substrate is a flexible substrate or a rigid substrate;
    an encapsulation layer formed on the array substrate; and
    a touch layer formed on a side of the encapsulation layer facing away from the array substrate;
    wherein the touch layer comprises an electromagnetic induction layer disposed in the touch layer, the electromagnetic induction layer comprises a plurality of induction coils, a first end of the induction coil is electrically connected to a first signal line, and a second end of the induction coil is electrically connected to a second signal line;
    wherein the electromagnetic induction layer comprises:
    a plurality of first induction coils formed on the encapsulation layer, wherein the plurality of first induction coils extend along a first direction and are disposed at intervals in a second direction;
    a first insulation layer covering the first induction coil; and
    a plurality of second induction coils formed on a side of the first insulation layer facing away from the first touch layer, wherein the plurality of second induction coils extend along the second direction and are disposed at intervals in the first direction.

11. The display device of claim 10, wherein the touch layer comprises a plurality of first touch driving electrodes formed on the encapsulation layer and a plurality of second touch driving electrodes formed on the first insulation layer; and
    the plurality of first touch driving electrodes extend along the first direction and are disposed at intervals in the second direction, and each of the first induction coils corresponds to one of the first touch driving electrodes and surrounds the first touch driving electrodes; the plurality of second touch driving electrodes extend along the second direction and are disposed at intervals in the first direction, each of the second induction coils correspond to one of the second touch driving electrodes and surrounds the second touch drive electrodes.

12. The display device of claim 11, wherein the array substrate comprises a plurality of sub-pixels disposed in an array, each of the first touch driving electrodes and the second touch driving electrodes comprise a grid structure, and an orthographic projection of mesh holes of the grid structures projected on the array substrate correspond one-to-one with the sub-pixels.

13. The display device of claim 10, wherein the first signal line comprises a first reference voltage signal line formed in a same layer as the first induction coil and a second reference voltage signal line formed in a same layer as the second induction coil; and the second signal line comprises a first electromagnetic signal line formed in the same layer as the first induction coil and a second electromagnetic signal line formed in the same layer as the second induction coil.

14. The display device of claim 10, wherein the plurality of induction coils are positioned on the encapsulation layer in an array arrangement, and the induction coils are multiplexed as third touch driving electrodes.

15. The display device of claim 14, wherein the induction coils are spiral.

16. The display device of claim 14, wherein the first signal line and the induction coils are formed in a same layer, the first signal line is electrically connected to a terminal end of the induction coil; the electromagnetic induction layer further comprises a second insulation layer covering the induction coil and the first signal line, the second signal line is formed on the second insulation layer, and the second signal line penetrates through the second insulation layer and is electrically connected to a beginning end of the induction coil.

17. The display device of claim 16, wherein the first signal line is disposed along a first direction or a second direction, and the first signal line is disposed in a gap region between two adjacent columns or two adjacent rows of the induction coils.

18. The display device of claim 17, wherein the second signal line is parallel to the first signal line.

* * * * *